(12) United States Patent
Maida

(10) Patent No.: US 6,366,170 B1
(45) Date of Patent: Apr. 2, 2002

(54) PNP HIGH-CURRENT, HIGH-SWING OUTPUT STAGE AND METHOD

(75) Inventor: Michael Maida, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/544,009

(22) Filed: Apr. 6, 2000

(51) Int. Cl.[7] .................................................. H03F 3/26
(52) U.S. Cl. ........................ 330/267; 330/292; 330/296
(58) Field of Search ................................ 330/263, 267, 330/268, 292

(56) References Cited

U.S. PATENT DOCUMENTS

| | | | | |
|---|---|---|---|---|
| 4,366,447 A | * | 12/1982 | Sugiyama | 330/267 |
| 5,081,426 A | * | 1/1992 | Imanishi | 330/296 |
| 5,337,012 A | * | 8/1994 | Dijkmans | 330/267 |
| 5,825,247 A | * | 10/1998 | Herrlinger | 330/267 |
| 6,011,431 A | * | 1/2000 | Gilbert | 330/305 |

* cited by examiner

Primary Examiner—Robert Pascal
Assistant Examiner—Khanh Van Nguyen
(74) Attorney, Agent, or Firm—Girard & Equitz LLP

(57) ABSTRACT

An amplifier output stage including a PNP transistor having an emitter coupled to a power rail and a collector coupled to an amplifier output. The PNP transistor is driven by an NPN transistor having a collector coupled to the base of the PNP transistor. A bias circuit produces a base-emitter voltage across the PNP transistor so that the PNP transistor will conduct a desired quiescent current. The bias circuit has an effective output impedance which is sufficiently large to form a pole in combination with a frequency compensation capacitor coupled to the collector of the PNP transistor, with the pole being located at a frequency beyond the unity-gain frequency of the amplifier.

37 Claims, 4 Drawing Sheets

PNP HIGH-CURRENT, HIGH-SWING OUTPUT STAGE AND METHOD

BACKGROUND OF THE INVENTION

1. Field of the Invention

The present invention relates generally to amplifier circuits and, in particular, an output stage of an amplifier capable of providing high currents at output levels close to the power supply rail.

2. Description of Related Art

There is an increasing demand for amplifier circuits having the capability of accepting input signals that come very close to the upper and lower supply voltages and capable of providing outputs which have the same capability. This is especially true in those application where the power supply voltages are small.

FIG. 1A is a schematic diagram of part of a conventional amplifier output. A PNP output transistor QA has an emitter coupled to the positive supply voltage VCC and a collector coupled to the amplifier output. Thus, transistor QA is capable of sourcing current to a load. Although not shown, there is typically another device connected to the output for sinking current from a load.

PNP transistor QA is driven by a pair of Darlington-connected NPN transistors QB and QC. A resistor RA is connected between the base and emitter of transistor QA. When driven hard, transistor QA is capable of becoming saturated so that the output can be pulled up within one saturation voltage of the positive supply VCC. Since the saturation voltage is typically on the order of tenths of a volt, the FIG. 1A circuit is capable of providing a high voltage swing, a very desirable feature in many applications.

The FIG. 1A circuit does posses certain shortcomings. By way of example, the settling time of the circuit is poor due to the high overall transconductance (gm) of the circuit. Further, the gam of the circuit changes significantly with changes in output current thereby making the circuit difficult to stabilize.

FIG. 2A is a schematic diagram of a portion of an alternative prior art output stage. Again, the output stage utilizes a PNP transistor QD having an emitter coupled to the positive supply VCC and a collector coupled to the output. Thus, the output is capable of swing up to almost the positive power supply VCC level. Transistor QD is driven by a pair of Darlington-connected NPN transistors QG and QF. A second PNP transistor QE is connected as a diode, with the base and emitter of QE being connected to the base and emitter of transistor QD, respectively.

The FIG. 1B circuit is an improvement over the FIG. 1A circuit in that the current gain is reduced by the presence of QE. Transistors QD and QE form a current mirror circuit, with the ratio of the currents limiting the current gain to a value substantially less than the current gain of transistor QD alone. The current ratio is determined by the ratio of the emitter areas of QE and QB, with QD typically being ten times as large as that of QB. Further, the slew rate or settling time of the circuit is improved over that of the FIG. 1A circuit.

Capacitor CA provides of Miller capacitor feedback which operates to stabilize the circuit. However, the impedance is so low at the base of transistor QE, the Miller capacitor feedback is not very effective. This makes the FIG. 1B circuit difficult to stabilize, particularly for large capacitive loads.

There is a need for an amplifier output stage capable of providing a high voltage swing and yet can be easily stabilized for a wide range of load currents and load capacitance. As will become apparent to those skilled in the art upon a reading of the following Detailed Description of the Invention together with the drawings, the present invention provides these and other advantages.

SUMMARY OF THE INVENTION

An amplifier output stage of an amplifier, including a PNP transistor having a collector coupled to an amplifier output and an emitter coupled to a first power supply rail. A second transistor, an NPN transistor, is included having a base for receiving an input signal and a collector coupled to the base of the first PNP transistor. The output stage includes a frequency compensation capacitor having one terminal coupled the PNP transistor. A bias circuit is included which produces a bias voltage across the base-emitter junction of the PNP transistor. The bias voltage is independent of current flow through the PNP transistor and causes the PNP transistor to conduct a desired quiescent current. The bias circuit has an effective output impedance sufficiently large to form a pole in combination with the frequency compensation capacitor at a frequency beyond the unity-gain frequency of the amplifier.

DETAILED DESCRIPTION OF THE INVENTION

Figure 2:
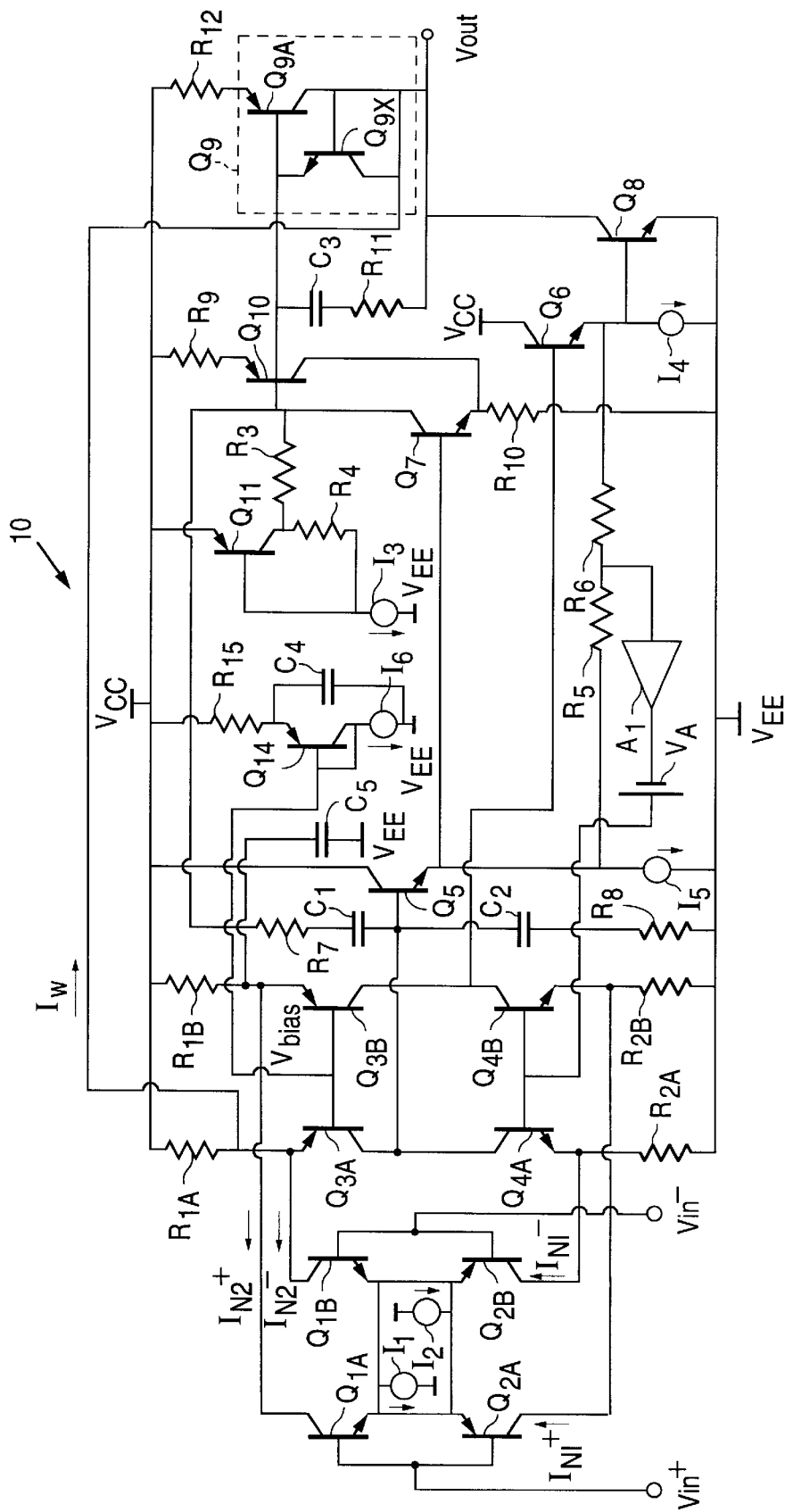
FIG. 2 is a schematic diagram of a amplifier circuit which includes an amplifier output stage in accordance with one embodiment of the present invention.

Referring again to the drawings, FIG. 2 is a schematic diagram of an amplifier circuit 10 which incorporates one embodiment of the subject output stage. It will be appreciated that other implementations of output stages in accordance with the present invention can be made.

Amplifier circuit 10 includes an input stage capable of operating with differential input Vin+ and Vin− operating close to the power supply rails VCC and VEE. The input stage includes NPN transistors Q1A and Q1B connected as a differential pair together with a tail current source I1. PNP transistors Q2A and Q2B form a second differential pair connected to a tail current source I2. The common bases of transistors Q1A and Q2A are connected to receive input Vin+, with the common based of transistors Q2A and Q2B being connected to received input Vin−.

Although not depicted, tail current steering circuitry operates to sense the common mode input voltage, (Vin++Vin−)/2, and turn off source I2 when the common mode input voltage is in the upper region of the voltage range defined by VCC and VEE and to turn off source I1 when the common mode voltage is in the lower region of the range. Thus, current outputs IN1+ and IN1− of differential pair Q2A and Q2B drop to zero when the common mode input voltage is in the upper range so that differential pair Q2A and Q2B are inactive. Similarly, current outputs IN2+ and IN2− of differential pair Q1A and Q1B drop to zero when the common mode input voltage is in the lower half of the voltage range thereby rendering differential pair Q1A and Q1B inactive.

The intermediate stage following the input stage is sometimes referred to as a cascode dual input turn-around stage. The output stage following the intermediate stage is implemented in accordance with one embodiment of the present invention.

The intermediate stage includes a pair of PNP transistors Q3A and Q3B connected in a common base configuration for level shifting currents IN2+ and IN2−. Transistors Q3A and Q3B are connected in series with resistors R1A and R1B, respectively, and are biased by voltage Vbias for operation close to upper supply voltage VCC. Voltage Vbias is produced by a PNP transistor Q14 which is connected as a diode. A resistor R15 is connected intermediate the emitter of Q14 and positive supply VCC.

The intermediate stage further includes a pair of NPN transistors Q4A and Q4B connected in a common base configuration for level shifting currents IN1+ and IN1−. Resistors R2A and R2B are connected in series with transistors Q4A and Q4B, respectively, with the transistors being biased by the output of a common mode feedback circuit to be described.

One-half of the differential output of the turn around stage is connected to the base of emitter-follower configured NPN transistor Q5. The other half of the differential output is connected to the base of emitter-follower configured transistor Q6. A pair of equal value resistors R5 and R6 are connected in series between the emitters of transistors Q5 and Q6 so that the voltage intermediate the resistors is indicative of the common mode voltage of the intermediate stage. The intermediate voltage is connected to the input of a buffer circuit A1, the output of which is connected to a level shifting element VA. The output of element VA is connected to the common bases of transistors Q4A and Q4B so as to provided a common mode feedback path. The feedback maintains transistors Q4A and Q4B in the active region and ensures that Q3A and Q4A have equal collector currents and that Q3B and Q4B have equal collector currents. Further details of the construction of buffer A1 and level shifter VA will be provided later.

The output of emitter-follower configured transistor Q6 is connected to the base of output NPN transistor Q8. The collector of output transistor Q8 is connected to the output of the amplifier circuit 10 where Vout is produced. Transistors Q6 and Q7 provide current gain for the negative swing of Vout. Transistors Q5 and Q7 drive output PNP transistor Q9 and provide current gain for the positive swing of Vout. Output transistor Q9 is shown in FIG. 2 with the primary PNP transistor Q9A and an associated parasitic transistor Q9X. As will be explained in greater detail, current flow associated with parasitic transistor Q9X is used to prevent transistor Q9 from becoming deeply saturated.

It is desirable that the output stage have the same current gain when sourcing and sinking current. A significant difference in gain can render the amplifier using the output stage difficult to stabilize. Transistors Q6 and Q8 determine the current gain when sinking current, with the gain being approximately equal to the product of the gain of each transistor. The transistors that would normally determine the current gain when sourcing current include Q5, Q7 and Q9. PNP transistor Q10 is provided for limiting the current gain of Q9 so that the sinking current gain is closer to the sourcing current gain. A resistor R9 is connected between the emitter of Q10 and supply VCC, with the collector of Q10 being connected between the emitter of Q7 and a resistor R10. Increased current flow through Q7 tends to turn on transistor Q10 harder thereby increasing the voltage drop across resistor R10. Once the increase in voltage at the emitter of Q7 becomes large with respect to the value of kT/q, transistor Q7 will tend to turn off thereby decreasing base drive to output transistor Q9. This local feedback thus limits the current gain at high output sourcing currents and has no effect at lower currents. Resistor R12 connected between the emitter of Q9 and power supply VCC represents the various ballast resistors associated with the individual transistors which make up large transistor Q9. As is well known, these individual ballast resistors ensure that current flow is evenly distributed among the individual transistors. Resistor R9 connected between the emitter of transistor Q10 and VCC operates to compensate for the voltage drop across resistor R12. In order to reduce power consumption, transistor Q10 has an emitter area which is typically 1/10 that of transistor Q9.

The quiescent current through output transistors Q8 and Q9 is well controlled since the base-emitter voltages of the two transistors are both defined. In the present case, the amplifier operates as a Class AB output, with there being a quiescent current typically of 250 $\mu$A and a peak output current of typically 100 mA.

The FIG. 2 output stage provides current limiting with no loss in voltage swing of Vout. When the output stage is sinking a large amount of current from a load through transistor Q8, transistor Q6 is driven on as much as possible, with transistor Q5 being shut off. The common mode feedback provided by buffer A1 and related circuitry operates to maintain the buffer input at the node intermediate resistors R5 and R6 at a constant voltage in order to ensure that transistors Q4A and Q4B are biased correctly. Since transistor Q5 is off, all of the current drawn by current source I5 is drawn through resistors R5 and R6. Transistor Q6 is the source of the current flow through R5 and R6. Under quiescent conditions, there is negligible current flow through resistors R5 and R6. Given that the voltage at the node between resistors R5 and R6 remains constant, the base-emitter voltage of transistor Q8 will increase by the increase in voltage drop across R6 (I5×R6) from quiescent operation to current limit. Since the maximum base-emitter voltage of transistor Q8 is thus defined, the current limit point of Q8 is also defined.

When the output stage is sourcing the maximum amount of current to a load by way of transistor Q9, transistor Q6 is off and transistor Q5 is driven on as much as possible. Thus, resistors R5 and R6 conduct all of the current drawn by current source I4. The emitter voltage of transistor Q5 will increase by a voltage equal to the increase in voltage across resistor R5 (I4×R5). Again, since the maximum base-emitter voltage of Q5 is set, the maximum current through the transistor is set. Note that the change emitter voltage of transistor Q7 when transistor Q10 begins conducting so as to reduce the current gain has only a negligible effect on the operation of the current limit function provided by resistor R5 and current source I4.

Figure 3:
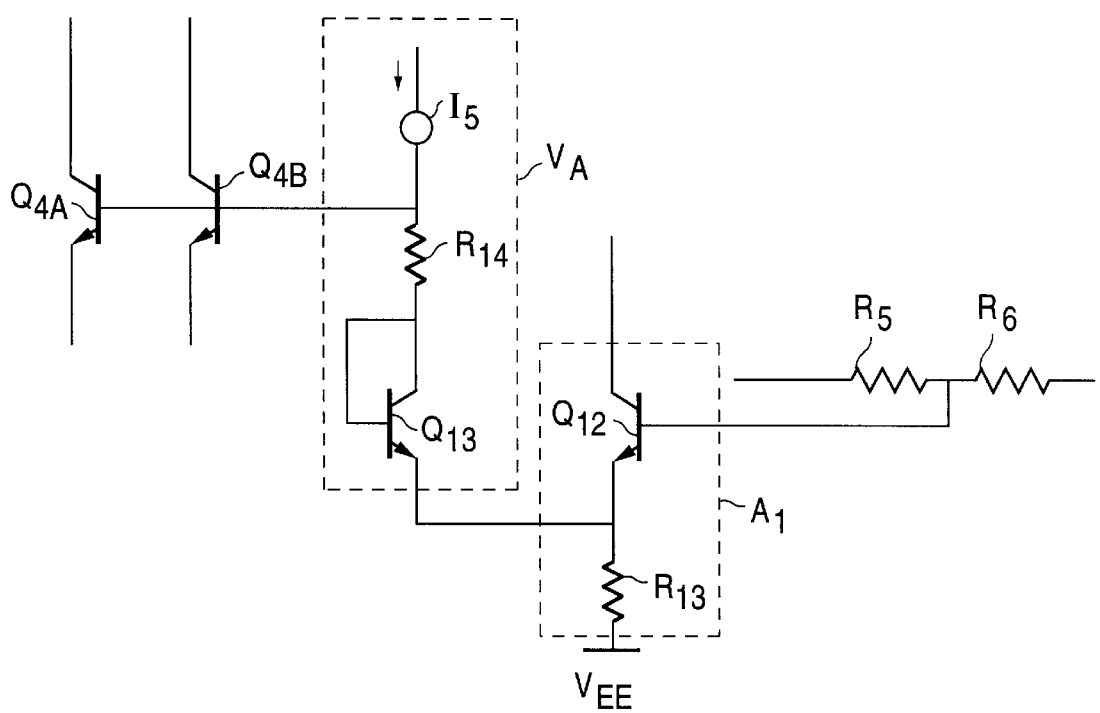
FIG. 3 is a schematic diagram of a detailed implementation of the common mode feedback circuit used in the FIG. 2 amplifier output circuit.

FIG. 3 is a schematic diagram showing one implementation of the buffer A1 and the level shifting circuit VA. The buffer circuit includes an emitter-follower configured NPN transistor Q12 having a base connected to the node intermediate resistors R5 and R6 and an emitter connected to supply VEE by way of resistor R13. The output of the buffer A1 is the connected to the emitter of a diode-connected transistor Q13. A constant current source I5 provides a constant current that flows through a resistor R14 and transistor Q13 so the base-emitter voltage of Q12 is canceled by the base-emitter voltage of transistor Q13. Thus, the voltage applied to the common bases of transistors Q4A and Q4B is equal to the voltage at the node intermediate resistors R5 and R6 plus the voltage drop across R14 (I5×R14).

The base transistor Q9 is biased by a bias circuit which provided an optimum base-emitter voltage and optimum impedance. PNP transistor Q11 has an emitter connected to the supply VCC and a collector connected to a current source by way of a resistor R4. Since the base current of Q11 is relatively small, most of the current into current source I3 is by way of resistor R4. Inspection of the circuit shows that the voltage at the collector of Q11, the thevenin equivalent output voltage of the bias circuit, is the base-emitter voltage of Q11 less the voltage drop across R4 produced by current I3. The output impedance of the bias circuit is approximately equal to the resistance of R3 plus the output impedance of transistor Q11. Output transistor Q9 is much larger, typically a few hundred times larger, the Q11. Thus, in order to bias Q9 with a base-emitter voltage so that Q9 conducts a desired quiescent current, typically on the order of 100 $\mu$A, it is necessary for the base-emitter voltage of Q11 to be reduced by some factor, typically by a 100 mV drop across resistor R4. The output impedance R of the bias circuit is selected such that the impedance in combination with Miller compensation capacitor C3 produce a pole at a frequency F=1/(2$\pi$ R C3) as a frequency that is approximately 2 to 3 times the overall unity-gain frequency of the amplifier. The impedance is thus high enough so that the Miller compensation capacitor C3 can be effective. Further, the impedance is low enough such that settling time and slew performance are good.

One important aspect of the output stage of FIG. 2 is that there is only a single PNP transistor, Q9, in the forward signal path. Since PNP transistors usually have a lower $F_T$ (unity current gain-bandwidth product) and a lower $\beta$ than an NPN transistor, performance is enhanced.

Figure 1A:
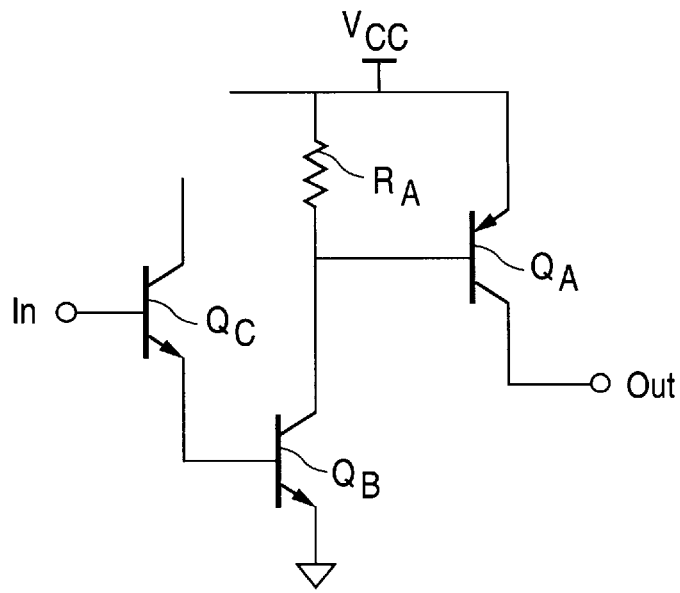
FIGS. 1A and 1B are schematic diagrams of part of conventional amplifier output stages.
Figure 1B:
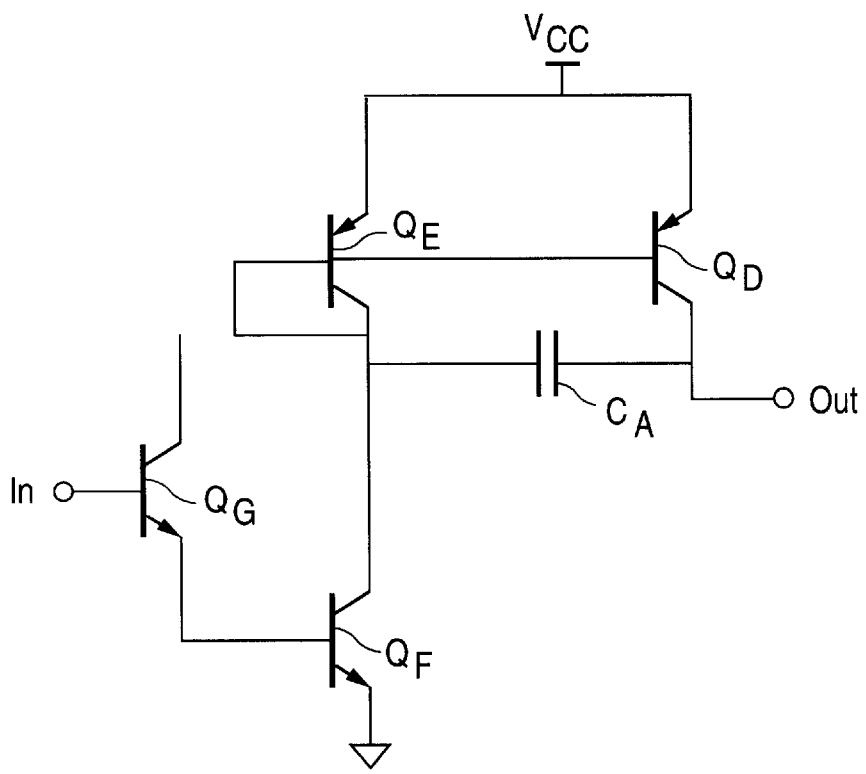

The FIG. 2 circuit is compensated by the Miller capacitor C3 and resistor R11 and by capacitor C2 and resistor R7. Unlike the prior art circuit of FIG. 1C, the impedance presented by resistor R3 and associated circuitry is large enough to make the Miller compensation capacitor C3 effective. Compensation capacitor C3 and R8 are optional.

Figure 6:
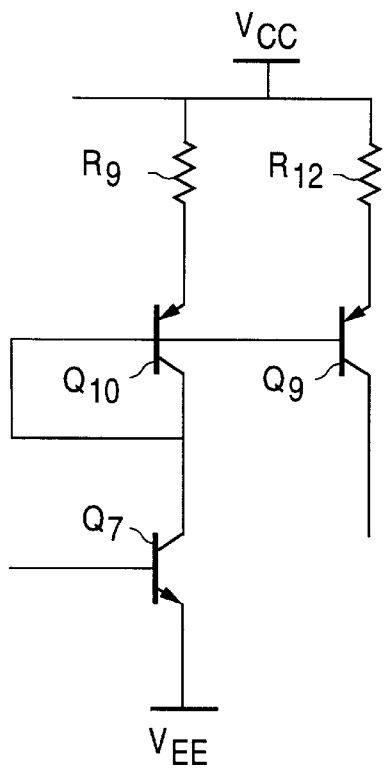
FIG. 6 is an alternative circuit arrangement for current gain limiting of the FIG. 2 amplifier output stage.

FIG. 6 shows an alternative connection for transistors Q7, Q9 and Q10 for limiting the current gain of the output stage when sourcing current. Rather than having the collector of Q10 connected to the emitter of transistor Q7 as shown in FIG. 2, transistor Q10 is diode-connected, with the collector/base of Q10 being connected to the collector of Q7. Transistors Q10 and Q9 operate together to form a current mirror, with the ratio of current between Q9 and Q10 effectively controlling the current gain of Q9. The current ratio of the two transistors is inversely related to the ratio of the emitter areas of Q9 and Q10, with Q9 typically being ten times larger than Q10. Thus, the effective current gain remains fixed at ten, a gain much lower than the typical current gain $\beta$ of Q9 alone. Accordingly, the current gains for sourcing and sinking current are more closely matched thereby causing the circuit operation to be more stable. Note that resistor R9 in the FIG. 6 embodiment performs a function in addition to compensating for the presence of transistor Q9 ballast resistors R12. Resistor R9 increases the impedance at the base of transistor Q9 thereby rendering the Miller compensation capacitor C3 (FIG. 2) effective.

Referring again to the FIG. 2 circuit, during normal operation, output voltage Vout is driven towards supply VCC so that transistor Q9 will be driven into saturation. Typically, the amplifier feedback action will attempt to force Vout to be equal to VCC, but no matter how much the base drive is increased, the saturation voltage will always be greater than zero. Further, the current gain or $\beta$ of Q9 will decrease substantially as a result so that a large base drive current for Q9 will be required to support a given output current. Further, many types of transistor structures made using junction-isolated processes have parasitic transistors which can turn on during saturation. These parasitic transistors may cause latchup and unpredictable IC behavior as a result. In order to reduce the magnitude of the base drive current and to conserve power, and in order to prevent possible latchup with respect to transistor Q9, saturation control circuitry is provided for output transistors Q8 and Q9.

Although not depicted, a conventional inverted mode transistor is connected across the base-collector junction of transistor Q8 which prevents the base-collector junction from being forward biased thereby keeping the transistor out of saturation. The base and collector of the inverted mode transistor are connected to the base and collector, respectively, of Q8, with the emitter of the inverted mode transistor being connected to the base of Q6.

Figure 4:
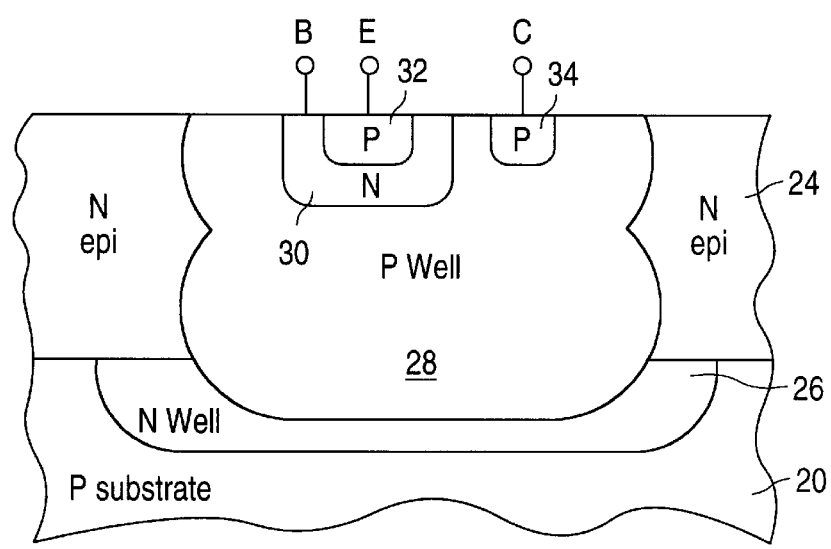
FIG. 4 is a cross-section of a conventional PNP transistor structure used as one of the output transistors of the FIG. 2 amplifier output stage.

The circuitry for limiting the saturation of transistor Q9 takes advantage of the junction-isolated vertical structure of the PNP transistor. FIG. 4 is a schematic illustration of a cross-section of in integrated circuit incorporating a PNP transistor such as Q9. The structure includes a P substrate 20 and an N type epitaxial layer 24. An N well 26 is formed in substrate followed by a P well 28 formed in the epitaxial layer 26 and substrate 20. A collector C contact for the PNP is formed in the P well 28 by way of P diffusion 34. An N region 30 is formed in the P well 28 to create the base B of the PNP, with the P region 32 formed in the N region 30 functioning as the emitter E of the transistor.

Figure 5:
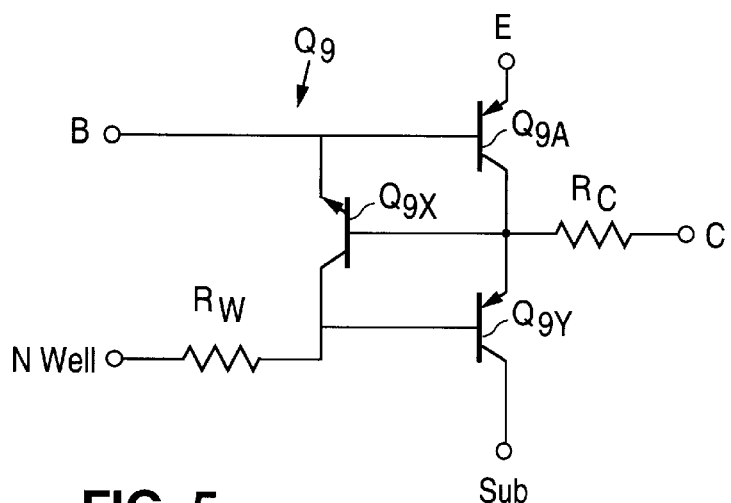
FIG. 5 is a schematic diagram of an equivalent circuit of the FIG. 4 transistor structure.

As previously noted, PNP transistor Q9 includes the desired transistor Q9A and a parasitic NPN transistor Q9X. The N type base region 30 forms the "emitter" of Q9X, the P well 28 forms the "base" and N well 26 forms the "collector". FIG. 5 is a schematic diagram showing the electrical relationship between desired transistor Q9A and the parasitic transistor Q9X. As can be see from FIG. 5, there is also a parasitic PNP transistor Q9Y having an "emitter" formed by t he P well 28, a "base" formed by the N well 26 and a "collector" formed by the substrate 20.

When the desired PNP transistor Q9A is driven into saturation, the collector-base junction becomes forward biased. If the forward biasing voltage is large enough, the "base-emitter" junction of parasitic transistor Q9X becomes forward biased thereby tuning the normally-off parasitic transistor Q9X on. This causes some of the base drive current for Q9 to be diverted to the N well 26 in the form of well current $I_W$. This current will cause a voltage to be developed across the N well parasitic resistance $R_W$ having a polarity which will tend to forward bias parasitic transistor Q9Y. As desired transistor Q9A is driven deeper into saturation, current $I_W$ will increase until one base-emitter voltage is developed across parasitic resistance $R_W$ thereby turning on parasitic PNP transistor Q9Y. This causes current flow from the upper supply VCC connected to the emitter of Q9A to the lower supply VEE connected to substrate 20, a current which can greatly exceed the quiescent current of the output stage. Thus, it is important to control the saturation limit of transistor Q9 so that the transistor will be deep enough into saturation to permit Vout swing up close to upper supply VCC and not so deep as to turn on the parasitic PNP transistors.

Saturation of transistor Q9 is controlled by monitoring the N well current $I_W$ of the transistor, that is, the current flow into the collector of parasitic transistor Q9X. The magnitude of this current is a function of the degree of forward bias of the base-collector junction of parasitic transistor Q9Y which represents the degree to which the transistor Q9Y is saturated.

As can be seen in FIG. 2, the N well of output transistor Q9 is connected to the node intermediate resistor R1A and transistor Q3A. When transistor Q9 is driven hard so that Vout approaches supply VCC, the transistor begins to saturate. As a result, current $I_W$ will begin to increase thereby decreasing the emitter voltage of transistor Q3A. This will cause the transistors Q5 and Q7 to begin to turn off thereby limiting base drive to Q9. Well current $I_W$ will no longer increase thereby allowing Q9 to remain saturated, but not so deeply saturated that parasitic transistor Q9Y (FIG. 5) is turned on.

The collector-to-N well capacitance of output transistor Q9 can be relatively large. The saturation control connection from Q9 back to Q3A provides a positive AC feedback path which requires compensation. Capacitor C4 connected between the node intermediate the emitter of transistor Q14 and resistor R14 and the negative supply voltage VEE compensates for the parasitic capacitance of Q9. Capacitor C5 connected between the node intermediate Q3B and resistor R1B and negative supply VEE compensates for the effect of capacitor C4. Ideally, capacitor C4 is a junction capacitor made to track the parasitic capacitance of Q9.

Thus, a novel output stage having high voltage swing capability has been disclosed. Although one embodiment has been described in some detail, it is to be understood that certain changes can be made by those skilled in the art without departing from the spirit and scope of the invention as defined by the appended claims.

What is claimed is:

1. An amplifier output stage of an amplifier, said output stage comprising:
   a first PNP transistor having a collector coupled to an amplifier output and an emitter coupled to a first power supply rail;
   a second NPN transistor having a base for receiving an input signal and a collector coupled to a base of the first PNP transistor;
   a first frequency compensation capacitor having one terminal coupled to the collector of the first PNP transistor; and
   a bias circuit configured to provide a thevenin equivalent bias voltage having an associated output impedance, with the bias circuit coupled to the base of the first PNP transistor so that the first PNP transistor will conduct a desired quiescent current, with the equivalent bias voltage being independent of current flow in the first PNP transistor, and with the output impedance being sufficiently large to form a pole in combination with the frequency compensation capacitor at a frequency beyond a unity-gain frequency of the amplifier.

2. The amplifier output stage of claim 1 wherein the bias circuit includes a semiconductor device having a PN junction which produces a PN junction voltage, with the equivalent bias voltage being a fraction of the PN junction voltage.

3. The amplifier output stage of claim 2 wherein the semiconductor device is a third transistor and the PN junction voltage is a base-emitter junction voltage.

4. The amplifier output stage of claim 3 wherein the bias circuit includes a first resistor coupled relative to the third transistor so the equivalent bias voltage is the difference between a voltage developed across the first resistor and the base-emitter voltage of the third transistor.

5. The amplifier output stage of claim 4 wherein the first resistor is coupled between the base and collector of the third transistor.

6. The amplifier output stage of claim 5 wherein the bias circuit further includes a second resistor connected between the first resistor and the base of the first PNP transistor.

7. The amplifier output stage of claim 3 further including a fourth PNP transistor having a base coupled to a base of the first transistor and a collector coupled to the second transistor.

8. The amplifier output stage of claim 7 wherein the collector of the fourth PNP transistor is coupled to an emitter of the second NPN transistor.

9. The amplifier output stage of claim 8 wherein a first resistor is connected intermediate the emitter of the second NPN transistor and a second power supply rail and wherein the collector of the fourth PNP transistor is coupled to a node intermediate the emitter of the second NPN transistor and the first resistor.

10. The amplifier output stage of claim 1 further including a third PNP transistor having a base coupled to the base of the first PNP transistor and a collector coupled to a collector of the second NPN transistor.

11. The amplifier output stage of claim 10 further including a first resistor coupled intermediate the emitter of the third PNP transistor and the first power supply rail.

12. The amplifier output stage of claim 11 further including a second resistor coupled intermediate the emitter of the first PNP transistor and the first power supply rail.

13. The amplifier output stage of claim 1 further including a third NPN transistor which provides the first input signal to the second NPN transistor, with the third NPN transistor having an emitter coupled to the base of the second NPN transistor.

14. The amplifier output stage of claim 13 further including a second frequency compensation capacitor coupled intermediate a base of the third NPN transistor and the collector of the second NPN transistor.

15. The amplifier output stage of claim 14 further including a first resistor connected in series with the first frequency compensation capacitor and a second resistor connected in series with the second frequency compensation capacitor.

16. An amplifier output stage comprising:
   a first PNP transistor having a collector coupled to an amplifier output and an emitter coupled to a first power supply rail and a base;
   a second NPN transistor having a base for receiving an input signal and
   a collector coupled to a base of the first PNP transistor; and
   a bias circuit configured to produce a thevenin equivalent bias voltage having an associated output impedance, with the bias circuit coupled to the base of the first PNP transistor and including a third PNP transistor and a first resistor connected relative to the third PNP transistor such that the equivalent bias voltage is equal to a difference in a base-emitter voltage of the third PNP transistor and a voltage drop across the first resistor, with the bias equivalent voltage having a magnitude which is smaller than a magnitude of the base-emitter voltage.

17. The amplifier output stage of claim 16 wherein the first resistor is connected between a collector and a base of the third PNP transistor.

18. The amplifier output stage of claim 17 wherein the bias circuit includes a current source connected to the first resistor so as to produce the voltage drop.

19. The amplifier output stage of claim 18 wherein the bias circuit further includes a second resistor having one terminal coupled to a collector of the third PNP transistor and another terminal coupled to the base of the first PNP transistor.

20. The amplifier output stage of claim 16 includes a frequency compensation capacitor and wherein the output impedance in combination with the compensation capacitor produce a pole which is at a frequency in excess of the unity-gain frequency of an amplifier incorporating the output stage.

21. A method of biasing an amplifier output stage having a first PNP transistor with an emitter coupled to a power supply rail and a collector coupled to an output of the amplifier output stage and a frequency compensation capacitor coupled to the first PNP transistor, said method comprising:

generating a base-emitter voltage using a second transistor;

generating a first voltage having a magnitude that is relatively independent of current flow in the first PNP transistor;

combining the base-emitter voltage and the first voltage to produce a bias voltage equal to a difference between the base-emitter voltage and the first voltage so that the bias voltage has a magnitude smaller than a magnitude of the base-emitter voltage; and coupling the bias voltage through an effective output impedance across the base-emitter junction of the first PNP transistor.

22. The method of claim 21 further including setting the effective output impedance so that the effective output impedance and a frequency compensation capacitor of the amplifier output stage produce a pole at a frequency in excess of a unity-gain frequency of an amplifier in which the output stage is incorporated.

23. An amplifier output stage of an amplifier, said output stage comprising:

a first PNP transistor having a collector coupled to an amplifier output and an emitter coupled to a first power supply rail;

a second NPN transistor having a base for receiving an input signal and a collector coupled to a base of the first PNP transistor;

a first frequency compensation capacitor having one terminal coupled to the collector of the first PNP transistor; and a bias circuit coupled to the first PNP transistor and configured to provide a therein equivalent bias voltage having an associated output impedance, with the bias circuit coupled to a base of the first PNP transistor so that the first PNP transistor will conduct a desired quiescent current, with said bias circuit being disposed outside a signal path defined by the base and collector of the second NPN transistor and the base and collector of the first PNP transistor and with the output impedance being sufficiently large to form a pole in combination with the first frequency compensation capacitor at a frequency beyond a unity-gain frequency of the amplifier.

24. The amplifier output stage of claim 23 wherein the bias circuit includes a semiconductor device having a PN junction which produces a PN junction voltage, with the equivalent bias voltage being a fraction of the PN junction voltage.

25. The amplifier output stage of claim 24 wherein the semiconductor device is a third transistor and the PN junction voltage is a base-emitter junction voltage.

26. The amplifier output stage of claim 25 wherein the bias circuit includes a first resistor coupled relative to the third transistor so the equivalent bias voltage is the difference between a voltage developed across the first resistor and the base-emitter voltage of the third transistor.

27. The amplifier output stage of claim 26 wherein the first resistor is coupled between the base and collector of the third transistor.

28. The amplifier output stage of claim 27 wherein the bias circuit further includes a second resistor connected between the first resistor and the base of the first PNP transistor.

29. The amplifier output stage of claim 25 further including a fourth PNP transistor having a base coupled to a base of the first transistor and a collector coupled to the second transistor.

30. The amplifier output stage of claim 29 wherein the collector of the fourth PNP transistor is coupled to an emitter of the second NPN transistor.

31. The amplifier output stage of claim 30 wherein a first resistor is connected intermediate the emitter of the second PNP transistor and a second power supply rail and wherein the collector of the fourth PNP transistor is coupled to a node intermediate the emitter of the second NPN transistor and the first resistor.

32. The amplifier output stage of claim 23 further including a third PNP transistor having a base coupled to the base of the first PNP transistor and a collector coupled to a collector of the second NPN transistor.

33. The amplifier output stage of claim 32 further including a first resistor coupled intermediate the emitter of the third PNP transistor and the first power supply rail.

34. The amplifier output stage of claim 33 further including a second resistor coupled intermediate the emitter of the first PNP transistor and the first power supply rail.

35. The amplifier output stage of claim 23 further including a third NPN transistor which provides the first input signal to the second NPN transistor, with the third NPN transistor having an emitter coupled to the base of the second NPN transistor.

36. The amplifier output stage of claim 34 further including a second frequency compensation capacitor coupled intermediate a base of the third NPN transistor and the collector of the second NPN transistor.

37. The amplifier output stage of claim 36 further including a first resistor connected in series with the first frequency compensation capacitor and a second resistor connected in series with the second frequency compensation capacitor.

* * * * *

UNITED STATES PATENT AND TRADEMARK OFFICE
CERTIFICATE OF CORRECTION

PATENT NO. : 6,366,170 B1
DATED : April 2, 2002
INVENTOR(S) : Michael Maida

It is certified that error appears in the above-identified patent and that said Letters Patent is hereby corrected as shown below:

Column 9,
Line 52, change "therein" to -- thevenin --.

Signed and Sealed this

Fourth Day of June, 2002

*Attest:*

*Attesting Officer*

JAMES E. ROGAN
*Director of the United States Patent and Trademark Office*